United States Patent
Saijo et al.

(10) Patent No.: US 10,927,463 B2
(45) Date of Patent: Feb. 23, 2021

(54) PRETREATING LIQUID FOR ELECTROLESS PLATING TO BE USED DURING REDUCTION TREATMENT, AND PROCESS FOR PRODUCING PRINTED WIRING BOARD

(71) Applicant: C. Uyemura & Co., Ltd., Osaka (JP)

(72) Inventors: Yoshikazu Saijo, Osaka (JP); Hisamitsu Yamamoto, Osaka (JP); Nobuhiko Naka, Osaka (JP)

(73) Assignee: C. UYEMURA & CO., LTD., Osaka (JP)

( * ) Notice: Subject to any disclaimer, the term of this patent is extended or adjusted under 35 U.S.C. 154(b) by 0 days.

(21) Appl. No.: 16/318,253

(22) PCT Filed: Jun. 19, 2017

(86) PCT No.: PCT/JP2017/022512
§ 371 (c)(1),
(2) Date: Jan. 16, 2019

(87) PCT Pub. No.: WO2018/029990
PCT Pub. Date: Feb. 15, 2018

(65) Prior Publication Data
US 2019/0264329 A1  Aug. 29, 2019

(30) Foreign Application Priority Data
Aug. 10, 2016 (JP) .............................. JP2016-158009

(51) Int. Cl.
| | | |
|---|---|---|
| C23C 18/26 | (2006.01) | |
| H05K 3/18 | (2006.01) | |
| C23C 18/16 | (2006.01) | |
| C23C 18/18 | (2006.01) | |
| C11D 7/04 | (2006.01) | |
| C11D 7/10 | (2006.01) | |

(52) U.S. Cl.
CPC .............. C23C 18/26 (2013.01); C11D 7/04 (2013.01); C11D 7/10 (2013.01); C23C 18/16 (2013.01); C23C 18/18 (2013.01); H05K 3/18 (2013.01); H05K 3/182 (2013.01); H05K 2203/072 (2013.01)

(58) Field of Classification Search
None
See application file for complete search history.

(56) References Cited

U.S. PATENT DOCUMENTS

| | | | | |
|---|---|---|---|---|
| 3,907,621 A * | 9/1975 | Polichette | ................ | C23C 18/26 216/17 |
| 4,515,829 A * | 5/1985 | Deckert | ................ | C23C 18/22 216/18 |
| 4,873,122 A * | 10/1989 | Darken | ................ | C23C 18/22 427/97.2 |
| 6,146,700 A * | 11/2000 | Yuan | ................ | H05K 3/108 427/304 |
| 6,776,827 B2 * | 8/2004 | Hasan | ................ | C25D 5/56 106/1.11 |
| 9,374,913 B2 * | 6/2016 | Saijo | ................ | C23C 18/1653 |
| 10,138,558 B2 * | 11/2018 | Saijo | ................ | C23C 18/2066 |
| 2003/0021887 A1 * | 1/2003 | Graves | ................ | H05K 3/381 427/58 |
| 2005/0014667 A1 * | 1/2005 | Aoyama | ........... | H01L 21/76802 510/175 |
| 2006/0199749 A1 | 9/2006 | Suzuki et al. | | |
| 2008/0083560 A1 | 4/2008 | Saiki et al. | | |
| 2008/0139436 A1 | 7/2008 | Reid | | |
| 2008/0178761 A1 | 7/2008 | Tomotake et al. | | |
| 2010/0120962 A1 * | 5/2010 | Yoshida | ................ | C23C 18/54 524/428 |
| 2011/0036625 A1 | 2/2011 | Narahashi et al. | | |
| 2011/0214994 A1 * | 9/2011 | Utsumi | ................ | C25D 5/34 205/211 |

(Continued)

FOREIGN PATENT DOCUMENTS

| | | | |
|---|---|---|---|
| JP | H09/152721 A | * | 6/1997 |
| JP | 2006-52425 | | 2/2006 |

(Continued)

OTHER PUBLICATIONS

English translation of the Written Opinion of the International Search Authority dated Jul. 18, 2017 for PCT/JP2017/022512; 4 pages.*
English translation of JP 2011/162806, Aug. 2011; 17 pages.*
English translation of JP 2010/229536, Oct. 2014; 9 pages.*
English translation of JPH 09/152721, Jun. 1997; 9 pages.*
Extended European Search Report dated Feb. 27, 2020 in corresponding European Patent Application No. 17839065.4.

(Continued)

*Primary Examiner* — Helene Klemanski

(74) *Attorney, Agent, or Firm* — Wenderoth, Lind & Ponack, L.L.P.

(57) ABSTRACT

A novel pretreating liquid for electroless plating which is used simultaneously with reduction treatment after roughening treatment of a filler-containing insulating resin substrate. A pretreating liquid for electroless plating is used simultaneously with reduction treatment when an insulating resin substrate containing a filler is roughened and residues generated on the insulating resin substrate are reduced. The pretreating liquid comprises: a reducing agent; and at least one selected from the group consisting of ethylene-based glycol ether represented by $C_mH_{(2m+1)}$-$(OC_2H_4)_n$-OH (m=an integer of 1 to 4, n=an integer of 1 to 4) and propylene-based glycol ether represented by $C_xH_{(2x+1)}$-$(OC_3H_6)_y$-OH (x=an integer of 1 to 4, y= an integer of 1 to 3).

2 Claims, 1 Drawing Sheet

(56) References Cited

U.S. PATENT DOCUMENTS

| | | | |
|---|---|---|---|
| 2011/0259373 A1* | 10/2011 | Hotta | H05K 3/0055 134/27 |
| 2015/0034590 A1 | 2/2015 | Takahashi et al. | |
| 2015/0072070 A1 | 3/2015 | Saijo et al. | |

FOREIGN PATENT DOCUMENTS

| | | | |
|---|---|---|---|
| JP | 2008-112987 | | 5/2008 |
| JP | 2009-270174 | | 11/2009 |
| JP | 2011-162806 | | 8/2011 |
| JP | 2013-129877 | | 7/2013 |
| JP | 2013-153223 | | 8/2013 |
| JP | 2010/229536 A | * | 10/2014 |
| TW | 201509812 | | 3/2015 |

OTHER PUBLICATIONS

International Search Report dated Jul. 18, 2017 in International (PCT) Application No. PCT/JP2017/022512.

Notice of Reasons for Refusal dated May 26, 2020 in corresponding Japanese Patent Application No. 2016-158009, with Machine translation.

Office Action dated Aug. 28, 2020, in corresponding Chinese Patent Application No. 201780046751.9, with English-Machine translation.

Office Action dated Oct. 19, 2020 in corresponding Taiwanese Patent Application No. 106121127, with English translation.

Office Action dated Nov. 24, 2020 in Japanese Patent Application No. 2016-158009, with English translation.

* cited by examiner

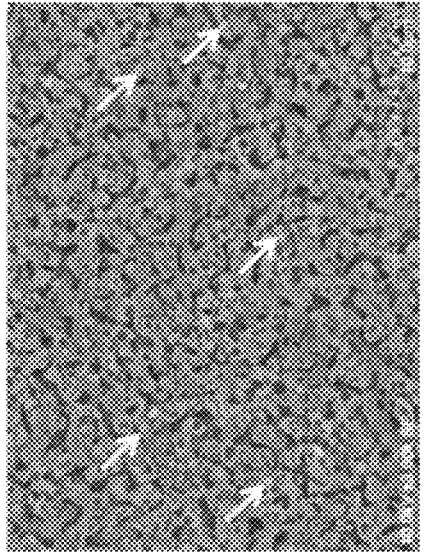
Fig.1(b) Working Example (No.5)
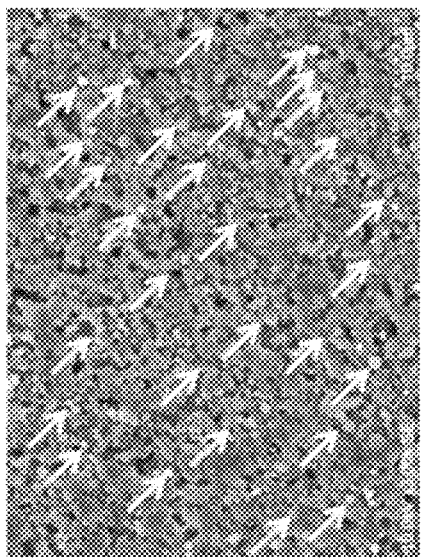
Fig.1(a) Comparative Example (No.19)

PRETREATING LIQUID FOR ELECTROLESS PLATING TO BE USED DURING REDUCTION TREATMENT, AND PROCESS FOR PRODUCING PRINTED WIRING BOARD

TECHNICAL FIELD

The present invention relates to a pretreating liquid for electroless plating to be used during reduction treatment in production of a printed wiring board containing a filler in an insulating resin, and a process for producing a printed wiring board.

BACKGROUND ART

The printed wiring boards widely used in the electronics and other fields usually may be often produced by applying a catalyst to an insulating resin substrate, carrying out electroless plating such as electroless copper plating, and if necessary, carrying out subsequent electroplating such as electrolytic copper plating. Since no chemical bond is formed between the insulating resin substrate and copper, high adhesion cannot be expected between the insulating resin substrate and a copper plating film. Thus, in the past, there has been adopted a method in which after an insulating resin substrate is swollen and then immersed in a roughening solution containing an oxidizing agent such as permanganate or chromate to roughen (etch) the surface of the insulating resin substrate and thus to form an anchor shape, whereby the adhesion between the insulating resin substrate and a copper plating film is enhanced. The above-described roughening solution is also called a desmear solution and is used to remove resin scum (smear) generated in many holes (such as blind vias and through holes for connecting a plurality of conductors and a trench used for forming a circuit) provided on a printed wiring board and on the substrate surface, along with the formation of the holes. A treatment method including a series of processes such as the above-described swelling treatment and roughening treatment (etching with an oxidizing agent), reduction treatment (also called neutralization treatment) for dissolving and removing a residue (such as manganese oxide derived from sodium permanganate) generated on the surface of a resin substrate by roughening treatment, and cleaning treatment with a conditioner is called a desmear treatment method.

The insulating resin may often contain a filler such as a silica-based filler, so that the insulating resin substrate can have improved mechanical and electrical characteristics, and at the same time, the anchor effect in the above-described roughening treatment enhances the adhesion between the insulating resin substrate and a plating film.

In recent years, there has arisen the problem of a decrease in the adhesion to the plating film as the surface roughness (anchor irregularities; represented by Ra) of the insulating resin substrate becomes small with high functionalization and high integration of printed wiring boards. In addition, as the thermal expansion coefficient of a resin material is reduced, the content of a filler contained in the resin material increases, and there is a problem that sufficient adhesion with the plating film cannot be ensured in the conventional desmear treatment.

Thus, the present applicant has disclosed, in Patent Document 1, a reduction and removal treatment liquid containing a reducing agent and a fluorine compound. The treatment liquid is a pretreating liquid for electroless plating used for forming a printed wiring board containing a filler in an insulating resin, and used for reducing residues such as oxides generated by roughening treatment and a reduction and removal process for removing the filler. It has been demonstrated that when a fluorine compound having the effect of removing a filler during reduction treatment is thus used as a filler removal treatment agent, high adhesion to a plating film can be obtained even with a substrate having a small surface roughness.

PRIOR ART DOCUMENT

Patent Document

Patent Document 1: JP-A-2013-153223

DISCLOSURE OF THE INVENTION

Problems to be Solved by the Invention

The present invention has been made to provide a novel pretreating liquid for electroless plating which is used simultaneously with reduction treatment after roughening treatment of a filler-containing insulating resin substrate.

Solutions to the Problems

The pretreatment liquid for electroless plating of the present invention which could solve the above problem is as follows.

Item 1

A pretreating liquid for electroless plating to be used simultaneously with reduction treatment when an insulating resin substrate containing a filler is roughened and residues generated on the insulating resin substrate are reduced, the pretreating liquid comprising:

a reducing agent; and at least one selected from the group consisting of ethylene-based glycol ether represented by $C_mH(2m+1)-(OC_2H_4)n-OH$ (m= an integer of 1 to 4, n= an integer of 1 to 4) and propylene-based glycol ether represented by $C_xH(2x+1)-(OC_3H_6)y-OH$ (x= an integer of 1 to 4, y= an integer of 1 to 3).

Item 2

The pretreating liquid for electroless plating according to above item 1, further comprising a fluorine compound.

Item 3

The pretreating liquid for electroless plating according to above item 1 or 2, wherein the insulating resin substrate contains a silica-based filler, and the content of $SiO_2$ in the insulating resin substrate is 30% by mass or more.

Further, the process for producing a printed wiring board of the present invention which could solve the above problem is as follows.

Item 4

A process for producing a printed wiring board, comprising:

a roughening treatment step of roughening an insulating resin substrate containing a filler;

a reduction and filler removal step of reducing residues generated on the insulating resin substrate by the roughening treatment step and, at the same time, removing the filler contained in the resin insulating substrate; and an electroless plating step of applying electroless plating to an insulating resin etched in the reduction and filler removal step, wherein in the reduction and filler removal step, a treating liquid containing a reducing agent and at least one selected from the group consisting of ethylene-based glycol ether represented by CmH(2m+1)-(OC$_2$H$_4$)n-OH (m= an integer of 1 to 4, n= an integer of 1 to 4) and propylene-based glycol ether represented by CxH(2x+1)-(OC$_3$H$_6$)y-OH (x=an integer of 1 to 4, y= an integer of 1 to 3) is used.

Item 5

The production process according to above item 4, wherein in the reduction and filler removal step, a treating liquid further comprising a fluorine compound is used.

Item 6

The production process according to above item 4 or 5, wherein the insulating resin substrate contains a silica-based filler, and the content of SiO$_2$ in the insulating resin substrate is 30% by mass or more.

Effect of the Invention

By using the pretreating liquid of the present invention, a printed wiring board having excellent adhesion between the filler-containing insulating resin substrate and the plating film can be obtained.

According to the present invention, for example, in consideration of production of a high-density and high-precision printed wiring board, even if surface roughness of the filler-containing insulating resin substrate is not roughened (that is, even if irregularities on the surface of the filler-containing insulating resin substrate are small), or even if the content of the filler contained in the insulating resin is large, the adhesion between the substrate and the plating film is remarkably improved. Thus, the technique of the present invention is preferably used for manufacturing a circuit board having a small surface roughness as in a high-speed signal, high-density wiring, and the like.

Further, the technique of the present invention is applied to not only production of a high density multilayer wiring board by a process for producing a wiring board and a build-up construction method, but also production of a multilayer wiring layer in a wafer level CSP (Chip Size epoxy Package or Chip Scale epoxy Package), TCP (Tape Carrier Package), or the like.

BRIEF DESCRIPTION OF THE DRAWING

FIG. 1 (*a*) is a surface SEM photograph of Test No. 19 (Comparative Example) in Table 1, and FIG. 1 (*b*) is a surface SEM photograph of Test No. 5 (Working Example) in Table 1.

MODE FOR CARRYING OUT THE INVENTION

The present inventors have been under consideration in order to provide a surface treatment method (desmear treatment) for producing a printed wiring board having good adhesion to a plating film even when surface roughness (Ra) of the filler-containing insulating resin substrate is as small as about 0.01 to 0.3 pun or the content of the filler (in terms of SiO$_2$) contained in the insulating resin is as much as about 30% by mass or more. As a result, the present inventors have found that the intended purpose is attained by using, as a treating liquid (treatment agent) to be used simultaneously with reduction treatment (neutralization treatment) after roughening treatment of the filler-containing insulating resin substrate, a treating liquid containing a reducing agent and at least one selected from the group consisting of ethylene-based glycol ether represented by CmH(2m+1)-(OC$_2$H$_4$)n-OH (m=an integer of 1 to 4, n=an integer of 1 to 4) and propylene-based glycol ether represented by CxH(2x+1)-(OC$_3$H$_6$)y-OH (x=an integer of 1 to 4, y=an integer of 1 to 3), thereby completing the present invention. The ethylene- or propylene-based glycol ether to be used in the present invention may hereinafter be abbreviated as the glycol ether.

In the present invention, the pretreating liquid (pretreating agent) for electroless plating to be used during reduction treatment means a pretreating liquid used together with a reducing agent when an insulating resin substrate containing a filler is roughened and residues generated on the insulating resin substrate are reduced. For example, taking a method of producing a printed wiring board by copper plating, as an example, when an insulating resin substrate containing a filler is subjected to swelling treatment, roughening treatment, reduction treatment (neutralization treatment) for reducing oxides generated in the roughening treatment, if necessary, ultrasonic treatment, drying, conditioning (cleaning), soft etching, pickling, catalyst imparting, electroless copper plating, and electrolytic copper plating to produce the printed wiring board, the pretreating liquid is a pretreating liquid to be used simultaneously with a reducing agent after the roughening treatment. In the present invention, the above-described pretreating liquid for electroless plating to be used simultaneously with reduction treatment may be abbreviated as the pretreating liquid. Further, the filler-containing insulating resin substrate may be referred to simply as an insulating resin substrate or a resin substrate.

The characteristic part of the present invention is that as a pretreating liquid to be used simultaneously with reduction treatment (neutralization treatment), the above-described glycol ether is used together with a commonly used reducing agent. As a result of the investigation conducted by the present inventors, they have found that good filler removing action is exhibited by using the above-described glycol ether together with the reducing agent during reduction treatment. As a result, they have found that good adhesion can be obtained even when a filler-containing insulating resin substrate having a small surface roughness or an insulating resin substrate containing a large amount of filler, which has been difficult to adhere to a plating film, is used, thereby completing the present invention.

This point will be described in a little more detail. Usually, when the filler-containing insulating resin substrate is etched by roughening treatment with an oxidizing agent (such as Mn in permanganate or the like), the oxidizing agent such as Mn is adsorbed on the surface of the filler contained in the insulating resin substrate and the surface of the resin holding the filler. While the oxidizing agent such as Mn adsorbed on the surface is dissolved by the subsequent reduction treatment (oxidation-reduction reaction) with a reducing agent (neutralizing agent), the filler is removed by oxygen gas generated at that time. In the roughening treatment, although a very narrow gap (interval) is formed between the filler reduced by etching and the resin holding the filler, the reducing agent (neutralizing agent) used for usual reduction treatment is inferior in permeability, and therefore, the reducing agent hardly penetrates into the very narrow gap. Thus, the above-described oxidation-reduction reaction does not sufficiently proceed, and the filler is hardly removed.

On the other hand, since the above-described glycol ether used in the present invention is excellent in permeability, the glycol ether penetrates into even the very narrow gap described above. As the glycol ether penetrates into the gap (together with the permeation of the glycol ether), a reducing agent also reaches the gap to penetrate into the gap and thus to enter the gap, whereby the reducing agent reacts with an oxidizing agent such as Mn to generate oxygen gas. It is considered that the filler is extruded and removed by the oxygen gas, and as a result, adhesion between a resin substrate and a plating film is remarkably improved.

That is, the glycol ether used in the present invention exhibits a good filler removing effect by being used in combination with a reducing agent and has an effect of contributing to improvement in adhesion to the plating film.

As described above, in the present invention, an insulating resin substrate which has been swollen is roughened using potassium permanganate or the like, and then, while the pretreating liquid of the present invention is applied, the filler is removed during dissolution and removal according to reduction reaction of treatment residues generated by the roughening treatment. This is because even if the filler is to be removed before the roughening treatment using potassium permanganate or the like, the filler is contained in the resin so as to be covered with the resin, and therefore, the filler cannot be removed effectively, so that a sufficient adhesion improvement effect between the insulating resin substrate and the plating film cannot be exhibited. Thus, in the present invention, the resin covering the filler is first removed by roughening the resin substrate, and then the filler is removed during removal of residues such as oxides generated by the roughening treatment.

The pretreating liquid for electroless plating of the present invention contains a reducing agent and at least one selected from the group consisting of ethylene-based glycol ether represented by $CmH(2m+1)\text{-}(OC_2H_4)n\text{-}OH$ (m=an integer of 1 to 4, n=an integer of 1 to 4) and propylene-based glycol ether represented by $CxH(2x+1)\text{-}(OC_3H_6)y\text{-}OH$ (x=an integer of 1 to 4, y=an integer of 1 to 3).

First, the following will describe the glycol ether used in the present invention. The glycol ether is one of the organic solvents, and has been used, for example, as a solvent for paint or ink. The glycol ether may include, for example, the ethylene glycol type (E.O. type) based on ethylene glycol, the propylene glycol type (P.O. type) based on propylene glycol, and other types. The present inventors have found that in the glycol ethers of the E.O. type and the P.O. type, particularly when the ethylene-based glycol ether represented by the following formula (1) and the propylene-based glycol ether represented by the following formula (2) are used in combination with a reducing agent, the effect as a removal treatment agent (filler removal treatment agent) such as a silica-based filler is further enhanced, so that adhesion between an insulating resin substrate and a plating film is remarkably improved. The reason why the adhesion is improved by using the glycol ether is, for example, that the filler exposed on the resin surface after roughening treatment is efficiently removed by the mechanism described above. Further, it is presumed that it is one factor improving the adhesion is that, after the roughening treatment, treatment is carried out with a reducing agent and a pretreating liquid containing the above-described glycol ether to swell the resin around the filler, so that the plating film tends to precipitate between the filler and the resin.

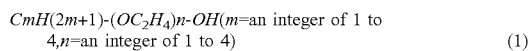

$CmH(2m+1)\text{-}(OC_2H_4)n\text{-}OH$(m=an integer of 1 to 4, n=an integer of 1 to 4)     (1)

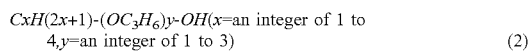

$CxH(2x+1)\text{-}(OC_3H_6)y\text{-}OH$(x=an integer of 1 to 4, y=an integer of 1 to 3)     (2)

Thus, the present invention is one having technical significance in that the glycol ethers represented by the formulas (1) and (2), in particular, among other glycol ethers act as good filler removing agents when used simultaneously with a reducing agent.

As in the present invention, Patent Document 1 also discloses a pretreating liquid to be used simultaneously with the reducing agent; however, in Patent Document 1, a fluorine compound is used as a filler removing agent at the time of reduction, and in this point, Patent Document 1 is different from the present invention using the above-described glycol ether as the filler removing agent at the time of reduction. When the glycol ether is used as in the present invention, the filler removing effect is more effectively exhibited as compared with the case where a fluorine compound is used, and as a result, the adhesion to the plating film is further improved. This point is also demonstrated in the column of examples to be described below, and peel strength as an index of adhesion was lowered in Test No. 22 in Table 1 using a fluorine compound instead of glycol ether.

As the ethylene-based glycol ether represented by the formula (1), there can be mentioned ethylene glycol methyl ether (n=1, m=1), ethylene glycol ethyl ether (n=1, m=2), ethylene glycol propyl ether (n=1, m=3), ethylene glycol butyl ether (n=1, m=4), diethylene glycol methyl ether (n=2, m=1), diethylene glycol ethyl ether (n=2, m=2), diethylene glycol propyl ether (n=2, m=3), diethylene glycol butyl ether (n=2, m=4), triethylene glycol methyl ether (n=3, m=1), triethylene glycol ethyl ether (n=3, m=2), triethylene glycol propyl ether (n=3, m=3), triethylene glycol butyl ether (n=3, m=4), tetraethylene glycol methyl ether (n=4, m=1), tetraethylene glycol ethyl ether (n=4, m=2), tetraethylene glycol propyl ether (n=4, m=3), and tetraethylene glycol butyl ether (n=4, m=4).

As the propylene-based glycol ether represented by the formula (2), there can be mentioned propylene glycol methyl ether (x=1, y=1), dipropylene glycol methyl ether (x=1, y=2), tripropylene glycol methyl ether (x=1, y=3), propylene glycol ethyl ether (x=2, y=1), dipropylene glycol ethyl ether (x=2, y=2), tripropylene glycol ethyl ether (x=2, y=3), propylene glycol propyl ether (x=3, y=1), dipropylene glycol propyl ether (x=3, y=2), tripropylene glycol propyl ether (x=3, y=3) propylene glycol butyl ether (x=4, y=1), dipropylene glycol butyl ether (x=4, y=2), and tripropylene glycol butyl ether (x=4, y=3).

The propyl and butyl in the glycol ethers represented by the formulas (1) and (2) may have a linear or branched chain structure.

Taking into consideration, for example, a further enhancement in adhesion, the glycol ether may preferably be ethylene-based glycol ethers represented by the formula (1), more preferably diethylene glycol butyl ethers (such as diethylene glycol mono-n-butyl ethers).

In the present invention, the glycol ethers represented by the formulas (1) and (2) may be used alone or in combination. As examples of combined use, there can be mentioned examples of using two or more glycol ethers represented by the formula (1), examples of using two or more glycol ethers represented by the formula (2), and examples of using at least one glycol ether represented by the formula (1) and at least one glycol ether represented by the formula (2).

The pretreating liquid of the present invention contains the above-described glycol ether and a reducing agent. The reducing agent used in the present invention is not particularly limited as long as it is a reducing agent usually used in reduction treatment after roughening treatment, and examples of the reducing agent include hydrogen peroxide, hydroxylammonium sulfate, glyoxylic acid, and various amine-based compounds such as hydroxylamine sulfate, ethylenediamine, diethylenetriamine, triethylenetetramine, tetraethylenepentamine, monoethanolamine, diethanolamine, ethylenediaminetetraacetic acid, and nitrilotriacetic acid.

The pH of the pretreating liquid according to the present invention is approximately 3.0 or less. As a result, the action of the reducing agent is effectively exhibited.

Here, if the total amount of the glycol ether, reducing agent, and water is defined as the "whole amount of pretreating liquid", the amount of the glycol ether contained in the pretreating liquid (this amount means the amount of only one glycol ether contained, when the only one glycol ether is contained in the pretreating liquid, or the total amount of two or more glycol ethers contained, when the two or more glycol ethers are contained in the pretreating liquid) may be preferably 30 g/L or more and 800 g/L or less, more preferably 50 g/L or more and 600 g/L or less, relative to the whole amount of pretreating liquid. When the amount of glycol ether is smaller than the above lower limit, the addition effect of glycol ether is not effectively exhibited, thereby lowing plating adhesion. On the other hand, even if glycol ether is added beyond the above upper limit, the addition effect of glycol ether is saturated, thereby becoming wasteful from an economical point of view.

The amount of the reducing agent contained in the pretreating liquid may be preferably 0.1 g/L or more and 500 g/L or less, more preferably 1 g/L or more and 300 g/L or less, relative to the whole amount of pretreating liquid. When the amount of the reducing agent is smaller than the above lower limit, the addition effect of the reducing agent is not effectively exhibited, thereby lowing removal performance for manganese adsorbed to the substrate. On the other hand, even if the reducing agent is added beyond the above upper limit, the addition effect of the reducing agent is saturated, thereby becoming wasteful from an economical point of view.

The pretreating liquid of the present invention contains a reducing agent and the above-described glycol ether and may further contain other components used for reduction treatment as long as the pH of the pretreating liquid satisfies the above range.

For example, the pretreating liquid may further contain a fluorine compound. The addition of the fluorine compound further improves the adhesion. As the fluorine compound to be used in the present invention, there can be mentioned, for example, acidic sodium fluoride, acidic ammonium fluoride, ammonium hydrogen difluoride as disclosed in JP-A-2010-106337, and fluorine compounds as disclosed in Patent Document 1 above (e.g., hydrogen fluoride; fluoroboric acid; sodium salts such as sodium fluoride and sodium hydrogen fluoride; and ammonium salts such as ammonium hydrogen fluoride, ammonium hexafluorosilicate, and ammonium hexafluorophosphate). These fluorine compounds may be added alone, or two or more of them may be used in combination.

The fluorine compound is useful for the enhancement of adhesion strength between an insulating resin substrate and a plating film. The fluorine compound preferably used in the present invention is acidic sodium fluoride or acidic ammonium fluoride, in which more preferred is acidic ammonium fluoride.

The amount of fluorine compound contained in the pretreating liquid (this amount means the amount of only one fluorine compound contained, when the only one fluorine compound is contained in the pretreating liquid, or the total amount of two or more fluorine compounds contained, when the two or more fluorine compounds are contained in the pretreating liquid) may be preferably 0.01 g/L or more and 100 g/L or less, more preferably 1 g/L or more and 50 g/L or less, relative to the total amount of pretreating liquid. When the amount of fluorine compound is below the lower limit, the addition effect of fluorine compound is not effectively exhibited, resulting in the lowering of adhesion strength. On the other hand, even if the fluorine compound is added beyond the above upper limit, the addition effect of the fluorine compound is saturated, thereby becoming wasteful from an economical point of view.

The pretreating liquid may further contain a surfactant, whereby permeability and the like are improved. The type of the surfactant is not particularly limited, but non-ionic surfactants and ionic surfactants can be used. These fluorine compounds may be added alone, or two or more of them may be used in combination.

The non-ionic surfactants are useful as the surface tension reducing agent of the pretreating agent. When a cationic surfactant is used as an additional surfactant, the non-ionic surfactant further exhibits the action as a dispersant of the cationic surfactant. Preferred examples of the non-ionic surfactant may include polyoxyethylene alkyl ether; and polyoxyethylene alkyl phenyl ethers such as polyoxyethylene octyl phenyl ether and polyoxyethylene nonyl phenyl ether. These non-ionic surfactants may be added alone, or two or more of them may be used in combination.

Further, the ionic surfactants include cationic surfactants, anionic surfactants, and ampholytic surfactants, all of which can be used in the present invention.

Among these, the cationic surfactants have the action of neutralizing electric charges by being adsorbed onto the surface of a negatively charged insulating resin substrate. Preferred cationic surfactants are poly(diallyl dimethyl ammonium chloride), copolymers of poly(diallyl dimethyl ammonium chloride) and acrylamide, and polyethyleneimine.

The anionic surfactants have the action of neutralizing electric charges by being adsorbed onto the surface of a positively charged insulating resin substrate. As the anionic surfactant, those disclosed in JP-A-2011-228517 can be used.

The ampholytic surfactants show the nature of anionic surfactants in an alkaline region and the nature of cationic surfactants in an acidic region. As described below, the pretreating liquid of the present invention may preferably indicate acidity of pH 3.1 or less, and therefore, it exhibits the nature of cationic surfactants by the use of ampholytic surfactants. As the ampholytic surfactants, those disclosed in JP-A-2011-228517 can be used.

In the present invention, the amount of the surfactant contained in the pretreatment agent (when only one surfactant is contained, it means the amount of this surfactant, or when two or more surfactants are contained, it means the total amount of these surfactants) may be preferably 0.1 g/L or more and 500 g/L or less, more preferably 1 g/L or more and 100 g/L or less, relative to the whole amount of pretreatment agent. When the amount of surfactant is below the above lower limit, the addition effect of surfactant is not effectively exhibited, deteriorating the precipitation properties of an electroless Cu plating film onto a glass. On the other hand, even if a surfactant is added beyond the above upper limit, the addition effect of surfactant is saturated, becoming wasteful from an economical point of view.

The foregoing has described in detail the components constituting the pretreating liquid of the present invention.

The following will describe a process for producing a printed wiring board according to the present invention. The production process of the present invention includes a roughening treatment step of roughening an insulating resin substrate containing a filler, a reduction and filler removal step of reducing residues generated on the insulating resin substrate by the roughening treatment step and, at the same time, removing the filler contained in the resin insulating substrate, and an electroless plating step of applying electroless plating to an insulating resin etched in the reduction and filler removal step. In this production process, the pretreating liquid of the present invention described above is used in the reduction and filler removal step. Since the production process of the present invention uses the pretreating liquid of the present invention described above, a printed wiring board having extremely excellent adhesion between the filler-containing insulating resin substrate and the plating film can be obtained.

The following will describe each step.

First, an insulating resin substrate containing a filler is prepared. The insulating resin to be used in the present invention is not particularly limited, so long as it is a resin usually used in desmear treatment and the like, and as such an insulating resin, the following resins can be mentioned, in addition to epoxy resins widely used as electrically insulating resins, imide resins, phenol formaldehyde resins, novolac resins, melamine resins, polyphenylene ether resins, bismaleimide-triazine resins, siloxane resins, maleimide resins, polyether ether ketone resins, polyether imide resins, and polyether sulfone resins. Needless to say, the present invention is not limited thereto. In addition to the above resins, it is also possible to use, for example, a resin produced by mixing two or more kinds of resins selected from the above-described resins at an arbitrary ratio.

Typical examples of the filler used in the present invention include a silica-based filler. The silica-based filler is useful for improving the mechanical and electrical characteristics and the like of the insulating resin substrate and also contributes to improvement in adhesion between the insulating resin substrate and the plating film due to the anchor effect during roughening treatment.

Excellent plating adhesion by the pretreating liquid of the present invention is effectively exhibited even when the amount of $SiO_2$ contained in the insulating resin is, for example, 30% by mass or more (further, for example, 40% by mass or more and 95% by mass or less) and, that is, the amount of $SiO_2$ contained in the insulating resin is large as compared with a usual silica-based filler.

Further, the excellent plating adhesion by the pretreating liquid of the present invention is effectively exhibited even when surface roughness (Ra) of the filler-containing insulating resin substrate is as small as approximately 0.01 to 0.1 μm.

Then, the filler-containing insulating resin substrate is swollen. By swelling treatment, the substrate surface is easily roughened in roughening treatment in the subsequent step. As a swelling liquid used in the swelling treatment, there can be mentioned, for example, N-methyl-2-pyrrolidone, N,N-dimethylacetamide, N,N-dimethyl formamide, γ-butyrolactone, and ethylene glycol monobutyl ether. The swelling treatment is preferably carried out by immersing the filler-containing insulating resin substrate in the swelling liquid at a temperature of about 60 to 90° C. for 10 to 30 minutes.

Then, the filler-containing insulating resin substrate subjected to the swelling treatment is washed with water, and then, the substrate surface is roughened (etched). As the etchant used for the roughening treatment, there can be mentioned aqueous sodium permanganate solution, aqueous potassium permanganate solution, aqueous sodium chromate solution, and aqueous potassium chromate solution. The roughening treatment is carried out by bringing the filler-containing insulating resin substrate washed with water into contact with an alkali solution of the above-described etchant. As the contact method, immersion and the like can be mentioned. Specifically, it is preferable that the filler-containing insulating resin substrate is brought into contact at a temperature of about 50 to 80° C. for 1 to 10 minutes, for example, to roughen the resin surface.

After the surface of the resin substrate is thus roughened, reduction and filler removal are carried out using the pretreating liquid of the present invention. Specifically, filler removal treatment using the above-described glycol ether is carried out at the same time as dissolution treatment (reduction treatment) according to reduction reaction for treatment residues such as manganese oxide generated on the resin substrate surface by roughening treatment.

It is preferable that the above-described reduction and filler removal is carried out, for example, by immersing the roughened filler-containing insulating resin substrate in the pretreating liquid of the present invention and carrying out treatment at a temperature of about 20 to 80° C. for about 5 seconds to 10 minutes. As a result, not only dissolution and removal of roughening residues such as manganese oxide but also filler removal are carried out.

Then, if necessary, ultrasonic treatment may be carried out, whereby the filler removing effect is enhanced, and the adhesion is further improved. As ultrasonic treatment conditions, for example, it is preferable to control the frequency within a range of 20 to 200 kHz. It is more preferable to control the frequency within a range of 24 to 100 kHz. When the frequency is below the above lower limit, the above effect is not effectively exhibited. On the other hand, when the frequency is beyond the upper limit, damage to the substrate becomes large. In addition, it is preferable to control an ultrasonic irradiation time within a range of approximately 10 seconds to 10 minutes. When the irradiation time is less than 10 seconds, the above effect is not effectively exhibited. On the other hand, if the irradiation time exceeds 10 minutes, excessive etching may occur with respect to the inner layer metal.

Then, the resin substrate is cleaned by cleaning treatment using a well-known method. This cleaning treatment removes dirt and the like from the resin substrate surface to clean the surface and, at the same time, imparts water-wettability to the resin substrate, so that the adhesion to the plating film to be formed in the subsequent step is further improved. The type of the solution used for this cleaning treatment is not particularly limited, and, for example, a cleaner/conditioner containing at least both a nonionic surfactant and a cationic surfactant is used. Specifically, it is preferable to immerse the above-described surface-treated resin substrate in a cleaner/conditioner at about 40° C. for 5 minutes.

After plating pretreatment is carried out as described above, plating treatment is carried out. The method of the plating treatment is not particularly limited, and a plating film is formed by adopting a commonly used method such as a semi additive method or a full additive method. For details of the plating treatment, reference can be made, for example, to Patent Document 1 described above and the description in JP-A-2015-71821.

Hereinafter, a plating treatment method according to the full additive method will be described in detail. In the following example, although a copper plating film is formed, the type of the plating film is not limited to the copper plating film but may be another metal plating film such as a nickel plating film. Instead of the plating treatment according to the full additive method, a plating film may be formed by electroplating using a semi additive method.

After the swelling treatment and the roughening treatment described above, reductive dissolution treatment and the filler removal are treated on treatment residues, generated by the roughening treatment, using the pretreating liquid of the present invention.

Then, a catalyst is applied to the resin substrate surface on which a circuit pattern is to be formed. The type of the catalyst used for the catalyst application is not particularly limited as long as the catalyst is commonly used, and, for example, a catalyst solution containing divalent palladium ions ($Pd^{2+}$), a mixed solution containing palladium chloride ($PdCl_2$-$2H_2O$), stannous chloride ($SnCl_2$-$2H_2O$), and hydrochloric acid (HCl), or the like can be used. For example, it is preferable that the mixed solution have a concentration of, for example, 100 to 300 mg/L as the Pd concentration, 10 to 20 g/L as the Sn concentration, and 150 to 250 mL/L as the HCl concentration. The insulating resin substrate is immersed in such a catalyst solution at a temperature of 30 to 40° C. for 1 to 3 minutes, for example, to first make a Pd—Sn colloid adsorbed on the resin substrate surface. Then, the insulating resin substrate is immersed in an accelerator (promoter) comprising 50 to 100 mL/L of sulfuric acid or hydrochloric acid, for example, under normal temperature conditions to activate the catalyst. Tin is removed from a complex compound by this catalyst activation treatment to provide palladium adsorption particles, which finally serves as a palladium catalyst to promote the subsequent copper deposition by electroless copper plating. Sodium hydroxide or an ammonia solution may be used as the accelerator. When the catalyst is applied to the resin substrate, pretreatment using a conditioner solution or a pre-dipping solution may be carried out to further enhance the adhesion between the resin substrate and the copper plating film, and furthermore, pretreatment for improving the wettability of the catalyst onto the resin substrate surface may be carried out.

Then, after the catalyst is applied to the insulating resin substrate in this way, if necessary, a plating resist for forming a desired circuit pattern is formed. That is, a resist pattern masking other portions than a part to be deposited with a copper plating film constituting a circuit pattern in the next step is formed. The resist pattern may be peeled and removed, after termination of plating treatment, by etching operation or the like, or the resist pattern may function as a solder resist without being peeled and removed after plating treatment. The method of forming a plating resist can be carried out using well-known methods.

After the plating resist is formed, a copper plating film is deposited by an electroless plating method to form a circuit pattern. When the copper plating film is to be deposited by the electroless plating method, after the formation of the plating resist, by using 10% sulfuric acid and reducer, for example, palladium adsorption particles of the catalyst adhered on the resin substrate surface are reduced to activate the catalyst, and deposition of copper plating on the resin substrate may be improved.

Specifically, as a plating bath used for the electroless copper plating, for example, a plating bath containing EDTA as a complexing agent can be used. As one example of the composition of the electroless copper plating bath described above, it is possible to use an electroless copper plating bath containing copper sulfate (10 g/L) and EDTA (30 g/L) and being adjusted to a pH of about 12.5 with sodium hydroxide. Alternatively, an electroless copper plating bath using Rochelle salt as a complexing agent may be used. The insulating resin substrate is immersed in this electroless copper plating bath at a temperature of 60 to 80° C. for 30 to 600 minutes, for example, to form a copper plating film. For example, when a via or the like for electrical conduction with a lower layer is formed in a multilayer wiring board, it is preferable to sufficiently stir the liquid so that ions are sufficiently supplied to the via. The stirring method is not particularly limited, but there can be used, for example, air stirring or any other stirring such as pump circulation.

In the plating treatment, two-step plating may be carried out to further enhance the adhesion to the insulating resin substrate. That is, primary plating treatment to form an underlying plating film on a resin substrate is carried out, and secondary plating treatment to form a thick plating film, of which thickness becomes thicker than the underlying plating film, on the formed underlying plating film may be carried out to form a circuit pattern. Particularly in the primary plating treatment, the internal stress has a direction different from the direction of the internal stress of the thick plating film formed by the secondary plating treatment; in other words, the internal stress has a direction opposite to the direction of the internal stress of the thick plating film formed by the secondary plating treatment, and plating treatment may be generally carried out using an electroless plating bath for forming an underlying plating film having tensile internal stress.

This application claims the benefit of priority to Japanese Patent Application No. 2016-158009, filed on Aug. 10, 2016. The entire contents of the specifications of Japanese Patent Application No. 2016-158009, filed on Aug. 10, 2016 are incorporated herein by reference.

EXAMPLES

Next, the present invention will be described more concretely by way of Examples and Comparative Examples. However, the present invention is by no means limited by modes of the Examples, and may appropriately be modified within a range not deviated from the gist of the present invention.

Example 1

In this example, the following samples were prepared using a pretreating liquid containing the components listed in Table 1. In Table 1, the fluorine compound means acidic ammonium fluoride (available from Kishida Chemical Co., Ltd.). The fluorine compound had a concentration of 5 g/L in all cases. On the other hand, a reducing agent had a concentration of 20 g/L in all cases.

Specifically, first, insulating resin substrates each having a glass epoxy substrate (FR-4 as the NEMA symbol) and a resin film ABF-GX92R (containing in the insulating resin substrate 45% by mass of a silica-based filler in terms of $SiO_2$) available from Ajinomoto Fine-Techno Co., Inc. layered on the glass epoxy substrate were swollen and roughened in the procedures as shown in Table 2, treated with various pretreating liquids as shown in Table 1, and if necessary, subjected to ultrasonic treatment (frequency: 28 KHz), dried, and treated with a cleaner/conditioner. The surface roughness Ra at this time was 0.18 μm. Then, the insulating resin substrates were softly etched, pickled, and provided with a Pd catalyst by the catalyst imparting process (predip, activator, reducer, and accelerator), followed by electroless copper plating and drying to form a plating film of 0.8 μm in thickness. Further, the plated substrates were dried, heat treated, cleaned, and pickled, followed by electrolytic copper plating under the condition of 2.5 A/dm$^2$ to form a copper plating film of 25 μm in thickness. The plated substrates were then subjected to discoloration preventive treatment, drying, and heat treatment to prepare the samples.

The samples thus prepared were measured for adhesion strength between a plating film and an insulating resin substrate as follows.

(Measurement of Adhesion Strength Between Plating Film and Insulating Resin Substrate)

A cut of 1 cm in width was made in each of the above samples, followed by 90° peel test according to the method as described in JIS-C5012, "8.5 Plating Adhesion", to measure peel strength with Autograph AGS-X Series Precision Universal Tester available from Shimadzu Corporation.

The results are shown in Table 1.

For reference, surface SEM photographs of Test No. 19 (Comparative Example) and Test No. 5 (Working Example) in Table 1 are shown.

TABLE 1

| Test No. | Classification | Pretreatment solution Type | Concentration | Fluorine compound | Reducing agent | Ultrasonic treatment after pretreatment | Evaluation Adhesion Peel strength |
|---|---|---|---|---|---|---|---|
| 1 | Ethylene glycol types | Ethylene glycol mono-n-butyl ether | 200 g/L | Not contained | hydrogen peroxide | Presence | 640 gf/cm |
| 2 | | Diethylene glycol mono-n-butyl ether | 200 g/L | Not contained | hydrogen peroxide | Presence | 675 gf/cm |
| 3 | | Diethylene glycol mono-n-butyl ether | 100 g/L | Not contained | hydrogen peroxide | Presence | 670 gf/cm |
| 4 | | Diethylene glycol mono-n-butyl ether | 300 g/L | Not contained | hydrogen peroxide | Presence | 680 gf/cm |
| 5 | | Diethylene glycol mono-n-butyl ether | 200 g/L | Contained | hydrogen peroxide | Presence | 705 gf/cm |
| 6 | | Diethylene glycol mono-n-butyl ether | 200 g/L | Not contained | hydroxylammonium sulfate | Presence | 680 gf/cm |
| 7 | | Diethylene glycol mono-n-butyl ether | 200 g/L | Not contained | glycocylic acid | Presence | 685 gf/cm |
| 8 | | Triethylene glycol mono-n-butyl ether | 200 g/L | Not contained | hydrogen peroxide | Presence | 670 gf/cm |
| 9 | | Tetraethylene glycol monomethyl ether | 200 g/L | Not contained | hydrogen peroxide | Presence | 648 gf/cm |
| 10 | | Diethylene glycol mono-n-butyl ether | 200 g/L | Not contained | hydrogen peroxide | Absence | 605 gf/cm |
| 11 | | Ethylene glycol monomethyl ether | 200 g/L | Not contained | hydrogen peroxide | Presence | 643 gf/cm |
| 12 | | Triethylene glycol mono-ethyl ether | 200 g/L | Not contained | hydrogen peroxide | Presence | 623 gf/cm |
| 13 | | Ethylene glycol monopropyl ether | 200 g/L | Not contained | hydrogen peroxide | Presence | 636 gf/cm |
| 14 | Propylene glycol types | Propylene glycol mono-methyl ether | 200 g/L | Not contained | hydrogen peroxide | Presence | 675 gf/cm |
| 15 | | Propylene glycol mono-ethyl ether | 200 g/L | Not contained | hydrogen peroxide | Presence | 645 gf/cm |
| 16 | | Propylene glycol mono-propyl ether | 200 g/L | Not contained | hydrogen peroxide | Presence | 639 gf/cm |
| 17 | | Dipropylene glycol monomethyl ether | 200 g/L | Not contained | hydrogen peroxide | Presence | 671 gf/cm |
| 18 | | Tripropylene glycol monomethyl ether | 200 g/L | Not contained | hydrogen peroxide | Presence | 664 gf/cm |
| 19 | | — | — | Not contained | hydrogen peroxide | Presence | 420 gf/cm |
| 20 | Ethylene glycol types | Diethylene glycol mono-n-butyl ether | 10 g/L | Not contained | hydrogen peroxide | Presence | 485 gf/cm |
| 21 | | N-methyl-2-pyrrolidone | 100 g/L | Not contained | hydrogen peroxide | Presence | 449 gf/cm |
| 22 | | — | — | Contained | hydrogen peroxide | Presence | 510 gf/cm |

TABLE 2

| Steps | Name of chemicals | Concentration | Treatment temperature (° C.) | Treatment time (min.) |
|---|---|---|---|---|
| Swelling | APPDES MDS-37 available from C. Uyemura & Co., Ltd. | 500 mL/L | 70 | 10 |
| Roughening | MDE-40 available from C. Uyemura & Co., Ltd. | 100 mL/L | 80 | 15 |
| | ELC-SH available from C. Uyemura & Co., Ltd. | 140 mL/L | | |
| Neutralization (Pretreatment) | See Table 1 | | 60 | 5 |
| Ultrasonic treatment | | | 25 | 5 |
| Drying | | | | |

TABLE 2-continued

| Steps | | Name of chemicals | Concentration | Treatment temperature (° C.) | Treatment time (min.) |
|---|---|---|---|---|---|
| | Cleaner/Conditioner | SULCUP MCD-PL available from C. Uyemura & Co., Ltd. | 50 mL/L | 40 | 5 |
| | Soft etching | Sodium persulfate | 100 g/L | 25 | 1 |
| | | Sulfuric acid | 100 g/L | | |
| | Pickling | Sulfuric acid | 100 g/L | 25 | 1 |
| Catalyst imparting | Predip | ALCUP MDP-2 available from C. Uyemura & Co., Ltd. | 10 mL/L | 25 | 2 |
| | | Sulfuric acid | 3 g/L | | |
| | Activator | ALCUP MAT-SP available from C. Uyemura & Co., Ltd. | 50 mL/L | 40 | 5 |
| | | 1N—NaOH | 40 mL/L | | |
| | Reducer | ALCUP MAB-4-A available from C. Uyemura & Co., Ltd. | 10 mL/L | 35 | 3 |
| | | ALCUP MAB-4-C available from C. Uyemura & Co., Ltd. | 50 mL/L | | |
| | | ALCUP MRD-2-C available from C. Uyemura & Co., Ltd. | 10 mL/L | | |
| | Accelerator | THRU-CUP MEL-3-A available from C. Uyemura & Co., Ltd. | 50 mL/L | 25 | 1 |
| Electroless copper plating | | THRU-CUP PEA-6-A available from C. Uyemura & Co., Ltd. | 100 mL/L | 36 | 15 |
| | | THRU-CUP PEA-6-B-2X available from C. Uyemura & Co., Ltd. | 50 mL/L | | |
| | | THRU-CUP PEA-6-C available from C. Uyemura & Co., Ltd. | 14 mL/L | | |
| | | THRU-CUP PEA-6-D available from C. Uyemura & Co., Ltd. | 15 mL/L | | |
| | | THRU-CUP PEA-6-E available from C. Uyemura & Co., Ltd. | 50 mL/L | | |
| | Drying Heat treatment | | | 150 | 30 |
| | Cleaner | THRU-CUP MSC-3-A available from C. Uyemura & Co., Ltd. | 100 mL/L | 40 | 5 |
| | Pickling | Sulfuric acid | 100 g/L | 25 | 1 |
| Electrolytic copper plating | | THRU-CUP ETN (2.5 A/dm$^2$) available from C. Uyemura & Co., Ltd. | | 25 | 45 (25 μm) |
| | Decoloration prevention | THRU-CUP AT-21 available from C. Uyemura & Co., Ltd. | 1 mL/L | 25 | 1 |
| | Drying Heat treatment | | | 190 | 60 |

The following discussion can be made from Table 1.

First, Test Nos. 1 to 18 are Working Examples using the pretreating liquid of the present invention. In all the cases of ethylene-based glycol types (Nos. 1 to 13) or propylene-based glycol types (Nos. 14 to 18), the peel strength was 600 gf/cm or more, and samples excellent in adhesion to a plating film were obtained. In detail, Test Nos. 2, 5 to 7, and 10 are examples in which diethylene glycol mono-n-butyl ether (n=2, m=4) was used at a concentration of 200 g/L, and good adhesion was obtained regardless of the type of the reducing agent. When ultrasonic treatment was carried out after the treatment with the pretreating liquid, the above effect was further improved as compared with Test No. 10 which was not subjected to ultrasonic treatment. Among the above examples subjected to ultrasonic treatment, in Test No. 5 further added with a fluorine compound, the adhesion was further improved, and the peel strength exceeded 700 gf/cm.

Test No. 20 is a reference example in which the concentration of glycol ether in ethylene glycol is low, and the adhesion was lowered.

On the other hand, Test Nos. 19, 21, and 22 are comparative examples of each using a pretreating liquid failing to fulfill any of the requirements of the present invention. These comparative examples had the following problems.

No. 19 was a comparative example containing only the reducing agent and not containing the glycol ether specified in the present invention, and the adhesion was lowered because the filler removing effect at the time of reduction was insufficient.

Test No. 21 is a comparative example using not the pretreating liquid of the present invention but a treating liquid containing N-methyl-2-pyrrolidone, which was commonly used for swelling treatment, and a reducing agent, the filler removing effect at the time of reduction was not effectively exhibited, and the adhesion was lowered.

Test No. 22 is a comparative example simulating Patent Document 1 and is an example using a fluorine compound instead of the glycol ether specified in the present invention. Although the addition of the fluorine compound improved the peeling strength of Test No. 22 as compared with Test Nos. 19 and 21 as Comparative Examples, it is understood that the peel strength of Test No. 22 was inferior to that of Test Nos. 1 to 18 as Working Examples.

Further, from FIG. 1, it is understood that the pretreating liquid of the present invention is excellent in the filler removing effect at the time of reduction. In detail, in Test No. 19 as Comparative Example, as shown in FIG. 1 (*a*), a large amount of filler (indicated by an arrow in the FIGURE) which was not removed remained on the surface, whereas in Test No. 5 as Working Example, almost no filler was observed as shown in FIG. 1 (*b*).

These results have demonstrated that in order to ensure desired adhesion, it is useful to use a reducing agent and a treating liquid containing the glycol ether specified in the present invention.

The invention claimed is:

1. A pretreating liquid for electroless plating to be used simultaneously with reduction treatment when an insulating resin substrate containing a filler is roughened and residues generated on the insulating resin substrate are reduced, the pretreating liquid comprising:
   a reducing agent;
   a fluorine compound;
   water; and
   at least one selected from the group consisting of
      ethylene-based glycol ether represented by $C_mH(2m+1)$-$(OC_2H_4)_n$-OH, wherein m=an integer of 1 to 4 and n=an integer of 1 to 4, and
      propylene-based glycol ether represented by $C_xH(2x+1)$-$(OC_3H_6)_y$-OH, wherein x=an integer of 1 to 4 and y=an integer of 1 to 3,
   wherein the pretreating liquid has a water content of 78 mass % or lower, and
   wherein the pretreating liquid has a pH of 3.0 or less.

2. The pretreating liquid for electroless plating according to claim 1, wherein the insulating resin substrate contains a silica-based filler, and the content of $SiO_2$ in the insulating resin substrate is 30% by mass or more.

\* \* \* \* \*